(12) United States Patent
Huang et al.

(10) Patent No.: US 11,025,366 B2
(45) Date of Patent: *Jun. 1, 2021

(54) CHANNEL ENCODING METHOD AND APPARATUS IN WIRELESS COMMUNICATIONS

(71) Applicant: HUAWEI TECHNOLOGIES CO., LTD., Guangdong (CN)

(72) Inventors: Lingchen Huang, Hangzhou (CN); Shengchen Dai, Hangzhou (CN); Chen Xu, Hangzhou (CN); Yunfei Qiao, Hangzhou (CN); Rong Li, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/749,848

(22) Filed: Jan. 22, 2020

(65) Prior Publication Data

US 2020/0235853 A1    Jul. 23, 2020

Related U.S. Application Data

(63) Continuation of application No. 16/118,740, filed on Aug. 31, 2018, now Pat. No. 10,594,439, which is a
(Continued)

(30) Foreign Application Priority Data

Sep. 8, 2017    (CN) .......................... 201710807301.9

(51) Int. Cl.
*H04L 1/00* (2006.01)
*H03M 13/09* (2006.01)
*H03M 13/13* (2006.01)
*H03M 13/29* (2006.01)
*H03M 13/00* (2006.01)
(Continued)

(52) U.S. Cl.
CPC .......... *H04L 1/0058* (2013.01); *H03M 13/09* (2013.01); *H03M 13/13* (2013.01);
(Continued)

(58) Field of Classification Search
None
See application file for complete search history.

(56) References Cited

U.S. PATENT DOCUMENTS 9,645,884 B2     5/2017  King et al.
10,536,240 B2 *  1/2020  Huang .................. H04L 1/0061
(Continued)

FOREIGN PATENT DOCUMENTS

CN    103220001 A    7/2013
CN    103780329 A    5/2014
(Continued)

OTHER PUBLICATIONS

Decision of Grant issued in Russian Application No. 2020112414/07 dated Jun. 16, 2020, 31 pages (With English Translation).
(Continued)

*Primary Examiner* — Justin R Knapp
(74) *Attorney, Agent, or Firm* — Fish & Richardson P.C.

(57) ABSTRACT

This application provides an encoding method and apparatus in wireless communications between a network device and a terminal. The method includes: performing cyclic redundancy check (CRC) encoding on A to-be-encoded information bits based on a CRC polynomial, to obtain a first bit sequence, where the first bit sequence includes L CRC bits and A information bits, L=11; and performing polar encoding on the first bit sequence.

20 Claims, 6 Drawing Sheets

Related U.S. Application Data continuation of application No. PCT/CN2018/085529, filed on May 4, 2018.

(52) U.S. Cl.
CPC ...... H03M 13/2906 (2013.01); H04L 1/0041 (2013.01); H04L 1/0061 (2013.01); *H04L 1/0057* (2013.01)

(56) References Cited

U.S. PATENT DOCUMENTS

| | | | |
|---|---|---|---|
| 10,594,439 B2* | 3/2020 | Huang | H03M 13/2906 |
| 2008/0320370 A1 | 12/2008 | Shinagawa et al. | |
| 2013/0061118 A1 | 3/2013 | Pi et al. | |
| 2014/0173376 A1 | 6/2014 | Jeong et al. | |
| 2014/0365842 A1 | 12/2014 | Li et al. | |
| 2015/0222295 A1 | 8/2015 | Li et al. | |
| 2016/0079999 A1 | 3/2016 | Shen et al. | |
| 2017/0155405 A1 | 6/2017 | Ge et al. | |
| 2017/0366199 A1 | 12/2017 | Shen et al. | |
| 2018/0034593 A1 | 2/2018 | Xu et al. | |
| 2018/0287738 A1 | 10/2018 | Xu et al. | |

FOREIGN PATENT DOCUMENTS

| | | |
|---|---|---|
| CN | 104219019 A | 12/2014 |
| CN | 106817195 A | 6/2017 |
| CN | 107026656 A | 8/2017 |
| CN | 107040262 A | 8/2017 |
| CN | 107124188 A | 9/2017 |
| CN | 107659381 A | 2/2018 |
| CN | 108234081 A | 6/2018 |
| RU | 2610251 C2 | 2/2017 |
| WO | 2014059780 A1 | 4/2014 |
| WO | 2014092502 A1 | 6/2014 |
| WO | 2014190915 A1 | 12/2014 |
| WO | 2017054164 A1 | 4/2017 |
| WO | 2017215486 A1 | 12/2017 |

OTHER PUBLICATIONS

3GPP TS 38.212 V0.0.1 (Jul. 2017),3rd Generation Partnership Project;Technical Specification Group Radio AccessNetwork;NR;Multiplexing and channel coding(Release 15),total 23 pages.

3GPP TSG RAN WG1 #88bis, R1-1705425, Samsung:"Design of a Nested Sequence for Polar Codes", Spokane, WA, Apr. 3-7, 2017. 8 pages. XP51243555.

3GPP TSG RAN WG1 Meeting #90, R1-1713237,ZTE:"Segmentation of Polar codes for large UGI", Prague, Czechia, Aug. 21-25, 2017. 6 pages. XP51328050.

3GPP TSG RAN WG1 Meeting NR#3, R1-1716742, InterDigital Inc.:"On CRC Polynomial for Uplink Polar Code Construction", Nagoya, Japan, Sep. 18-21, 2017. 8 pages. XP51353845.

3GPP TSG RAN WG1 NR Ad-Hoc#2, R1-1710471, Huawei, HiSilicon:""CRC polynomial for L 1 control information andMIB"", Qingdao, China, Jun. 27-30, 2017. 3 pages. XP51299682.

EPO Communication pursuant to Article 94(3) EPC issued in European Application No. 18752076.2 dated Apr. 17, 2020, 6 pages.

Huawei, HiSilicon, "CRC polynomial for L1 control information and MIB," 3GPP TSG RAN WG1 NR Ad-Hoc#2, R1-1710471, Qingdao, China, Jun. 27-30, 2017, 3 pages.

Huawei, HiSilicon, "Uplink code construction," 3GPP TSG RAN WG1 Meeting NR#3, R1-1715495; Nagoya, Japan, Sep. 18-21, 2017, 13 pages.

InterDigital Inc., "On CRC Polynomial for Uplink Polar Code Construction," 3GPP TSG RAN WG1 Meeting NR#3, R1-1716742, Nagoya, Japan, Sep. 18-21, 2017, 8 pages.

Samsung, "Design of a Nested Sequence for Polar Codes",3GPP TSG RAN WG1 #88bis, R1-1705425; Spokane, WA, Apr. 3-7, 2017 8 pages.

ZTE, "Segmentation of Polar codes for large UCI," 3GPP TSG RAN WG1 Meeting #90, R1-1713237, Prague, Czechia, Aug. 21-25, 2017, 6 pages.

Office Action issued in Australian Application No. 2018328362 dated Oct. 6, 2020, 3 pages.

Office Action issued in Japanese Application No. 2020-513723 dated Dec. 1, 2020, 8 pages (with English translation).

Murata et al., "CRC Design for List Decoding of Polar Codes," The Institute of Electronics, Information and Communication Engineers, IEICE Technical Report, Jan. 2016, 6 pages (with English translation).

Office Action issued in Japanese Application No. 2020-513723 dated Feb. 16, 2021, 6 pages (with English translation).

Office Action issued in Indian Application No. 202047011736 dated Mar. 19, 2021, 7 pages.

* cited by examiner

CHANNEL ENCODING METHOD AND APPARATUS IN WIRELESS COMMUNICATIONS

CROSS-REFERENCE TO RELATED APPLICATIONS

This application is a continuation of U.S. patent application Ser. No. 16/118,740, filed on Aug. 31, 2018, which is a continuation of International Application No. PCT/CN2018/085529, filed on May 4, 2018. The International Application claims priority to Chinese Patent Application No. 201710807301.9, filed on Sep. 8, 2017. All of the aforementioned patent applications are hereby incorporated by reference in their entireties.

TECHNICAL FIELD

This application relates to the field of communications technologies, and in particular, to an encoding method and apparatus.

BACKGROUND

In a communications system, channel encoding is usually performed to improve reliability of data transmission and ensure quality of communication. Currently, a 5G mobile communications system includes three major application scenarios enhanced mobile broadband (eMBB), ultra-reliable low-latency communications (URLLC), and massive machine-type communications (mMTC), new requirements are put forward for data communication, and a polar code is a first channel encoding method that can be strictly proved to "have reached" a channel capacity, and may be applicable to a 5G communications system and a future communications system.

SUMMARY

This application provides an encoding method and apparatus. According to a first embodiment, this present disclosure application provides an encoding method, including performing, by a transmit end based on a cyclic redundancy check (CRC) polynomial, CRC encoding on A to-be-encoded information bits, to obtain a first bit sequence, where the first bit sequence includes L CRC bits and A information bits, L and A are positive integers, L=11, and the CRC polynomial is any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+D+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and performing polar encoding on the first bit sequence.

By using this encoding manner, a false alarm rate (FAR) requirement may be satisfied, to ensure that communication is normally performed.

In a second embodiment, the transmit end is a base station or a terminal. According to this embodiment, this application provides an encoding apparatus, including: a first encoding module, configured to perform, based on a cyclic redundancy check (CRC) polynomial, CRC encoding on A to-be-encoded information bits, to obtain a first bit sequence, where the first bit sequence includes L CRC bits and A information bits, L and A are positive integers, L=11, and the CRC polynomial is any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+D+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and a second encoding module, configured to perform polar encoding on the first bit sequence.

According to a third embodiment, this application provides an encoding apparatus, including a processor. The processor is configured to perform, based on a cyclic redundancy check (CRC) polynomial, CRC encoding on A to-be-encoded information bits, to obtain a first bit sequence, where the first bit sequence includes L CRC bits and A information bits, L and A are positive integers, L=11, and the CRC polynomial is any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+D+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and perform polar encoding on the first bit sequence.

The processor may be a circuit, one or more integrated circuits, or one or more dedicated chips. The processor may alternatively be a general-purpose chip, and when the program instruction used to implement the encoding method is loaded into the processor, the foregoing encoding function may be implemented. The processor may alternatively be a combination of one or more of a circuit, an integrated circuit, a dedicated chip, and a general-purpose chip.

In some embodiments, the CRC polynomial is implemented by using a shift register. In another embodiment, the L CRC bits in the first bit sequence are located after the A to-be-encoded information bits. In yet another embodiment, the transmit end sends the first polar-encoded bit sequence. In yet another embodiment, the encoding method may be implemented by using hardware, for example, implemented by using a circuit or one or more integrated circuits. The encoding method may alternatively be implemented by using software. For example, one or more processors perform the encoding method by reading an instruction stored in a memory. The one or more processors may be integrated in a chip, or may be distributed in a plurality of chips. The encoding method may alternatively be partially implemented by using hardware and partially implemented by using software. For example, a processor performs the step of "performing, based on a cyclic redundancy check (CRC) polynomial, CRC encoding on A to-be-encoded information bits, to obtain a first bit sequence" by reading an instruction stored in a memory, and the step of "performing polar encoding on the first bit sequence" is implemented by using a logic circuit or an accelerator. Certainly, during specific implementation, persons skilled in the art may alternatively use a combination of the foregoing manners.

The unique and novel CRC polynomial provided in this application allows for the FAR requirement of a system to be satisfied, and ensures that communication is normally performed.

DESCRIPTION OF EMBODIMENTS

Figure 1:
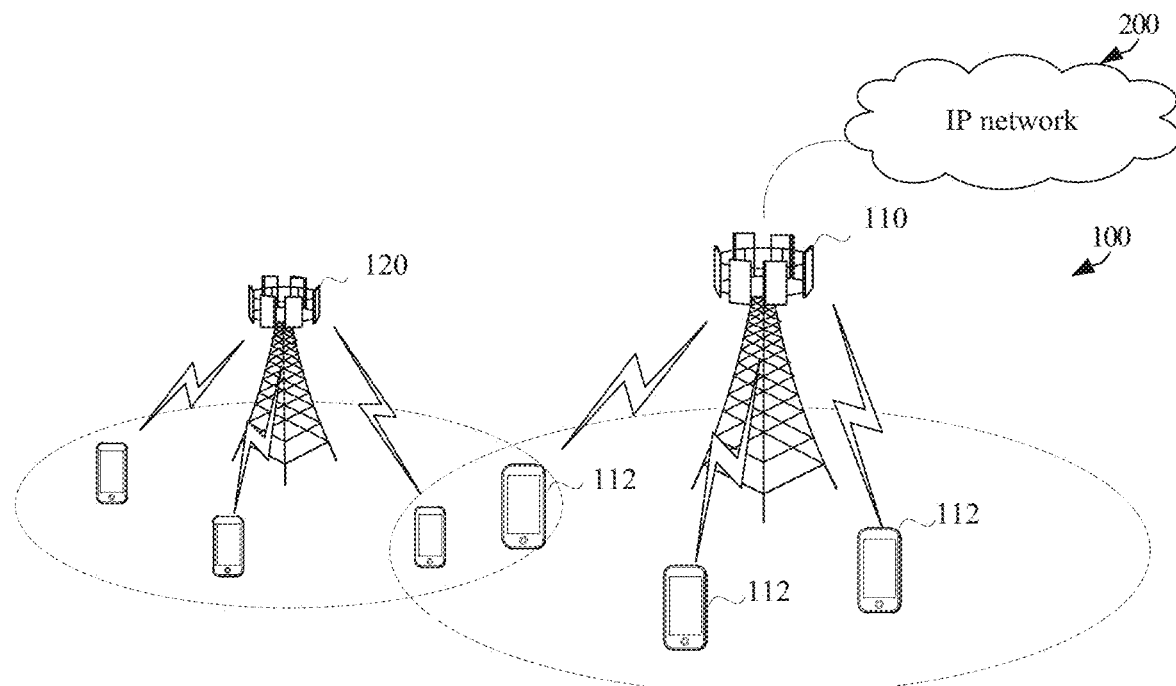
FIG. 1(a) and FIG. 1(b) are schematic architectural diagrams of a communications system according to an embodiment of this disclosure.
Figure 1:
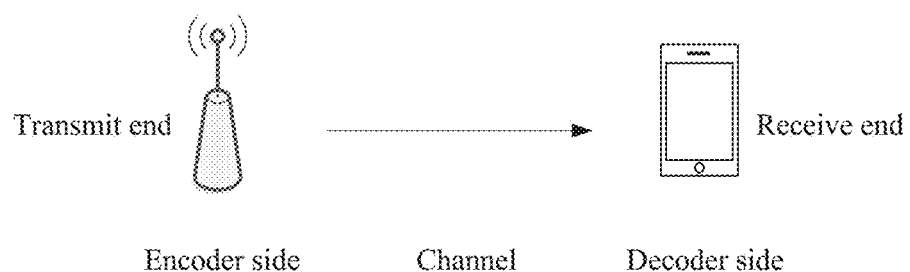

To further improve encoding performance of a system, an outer code having a check capability, for example, a cyclic redundancy check (CRC) code, may be concatenated with the polar code. When a decoding manner such as serial cancellation list decoding is used, selection is usually performed on survivor paths based on cyclic redundancy check after decoding ends, so as to improve channel encoding performance of the system. When the polar code is used for a control channel, in addition to a block error rate (BLER) that is a normal technical indicator, a false alarm rate (FAR for short) indicator further needs to be satisfied. For example, if a quantity of CRC bits is L, a decoding manner such as serial cancellation list decoding is used, cyclic redundancy check is used after decoding ends, and T paths of survivor paths are checked, an FAR is usually required to be less than $(2^{\wedge}(-L+\log_2(T)))$. It should be noted that, selection on a value T does not depend on a cyclic redundancy check polynomial and a length, but depends on decoding implementation complexity, decoding performance, and the like. Therefore, how to find an appropriate manner of concatenating a CRC check code and a polar code according to an FAR requirement needs to be considered. This application puts emphasis on determining an appropriate CRC polynomial based on a value of L, so as to satisfy a system requirement, and ensure that communication is normally performed.

A polar code is a linear block code. A generator matrix of the polar code is $G_N$. An encoding process of the polar code is $x_1^N = u_1^N G_N$. $u_1^N = (u_1, u_2, \ldots, u_N)$ is a binary row vector whose length is N (namely, a code length). $G_N = F_2^{\otimes (\log_2(N))}$, where $$F_2 = \begin{bmatrix} 1 & 0 \\ 1 & 1 \end{bmatrix},$$

and $F_2^{\otimes (\log_2(N))}$ is defined as a Kronecker product of $\log_2 N$ matrices $F_2$. $x_1^N$ are encoded bits (also referred to as a code word), where the encoded bits are obtained after $u_1^N$ is multiplied by the generator matrix $G_N$, and a multiplication process is the encoding process. In the encoding process of the polar code, some bits of $u_1^N$ are used to carry information and are referred to as information bits, and a set of indexes of the information bits is marked as $\mathcal{A}$; and other bits of $u_1^N$ are set to fixed values on which a receive end and a transmit end agree in advance, and are referred to as frozen bits, and a set of indexes of the frozen bits is represented by using a complementary set of $\mathcal{A}^c$ of $\mathcal{A}$. A frozen bit is usually set to 0. Provided that the receive end and the transmit end agree in advance, a frozen bit sequence may be arbitrarily set.

Embodiments of this application may be applied to a wireless communications system. It should be noted that, the wireless communications system mentioned in the embodiments of this application includes, but is not limited to: a Long Term Evolution (LTE) system, and three major application scenarios of a next-generation 5G mobile communications system: enhanced mobile broadband (eMBB), URLLC, and massive machine-type communications (mMTC). Alternatively, the wireless communications system may be a device to device (D2D) communications system, another communications system, a future communications system, or the like.

A communications apparatus related to this application may be configured in a communications device, and the communications device mainly includes a network device or a terminal device. If a transmit end in this application is a network device, a receive end is a terminal device; or if a transmit end in this application is a terminal device, a receive end is a network device.

In an embodiment of this application, as shown in FIG. 1(a), a communications system 100 includes a network device 110 and a terminal 112. When the wireless communications network 100 includes a core network, the network device 110 may be further connected to the core network. The network device 110 may further communicate with an IP network 200 such as the Internet, a private network, or another data network. A network device provides a service for a terminal within coverage. For example, referring to FIG. 1(a), the network device 110 provides wireless access for one or more terminals within coverage of the network device 110. In addition, an overlapping area may exist within coverage of network devices such as the network device 110 and a network device 120. Network devices may further communicate with each other. For example, the network device 110 may communicate with the network device 120.

When the network device 110 or the terminal 112 sends information or data, an encoding method described in the embodiments of this application may be used. Therefore, for convenience of description, in this embodiment of this application, the communications system 100 is simplified to a system that includes a transmit end 101 and a receive end 102, as shown in FIG. 1(b). The transmit end 101 may be the network device 110, and the receive end 102 is the terminal 112; or the transmit end 101 is the terminal 112, and the receive end 102 is the network device 110. The network device 110 may be a device configured to communicate with the terminal device. For example, the network device 110 may be an evolved NodeB (eNB or eNodeB) in an LTE system, a network side device in a 5G network, a network side device communicating with a terminal in another network, or a network side device in a future network. Alternatively, the network device may be a relay station, an access point, an in-vehicle device, or the like. In a device to device (D2D) communications system, the network device may be a terminal playing a role of a base station. The terminal may include various handheld devices, in-vehicle devices, wearable devices, or computing devices having a wireless communications function, or another processing device connected to a wireless modem, and various forms of user equipment (UE), mobile stations (MS), and the like.

An encoding process related to this application is roughly: performing CRC check on to-be-encoded information; if necessary, performing an operation such as interleaving on a CRC-checked bit sequence; and then performing polar encoding. In addition, one or more of, including but not limited to, rate matching, modulation, digital-to-analog conversion, and frequency conversion may be further performed, based on a target code length M, on encoded bits obtained after polar encoding.

Figures 2, 3:
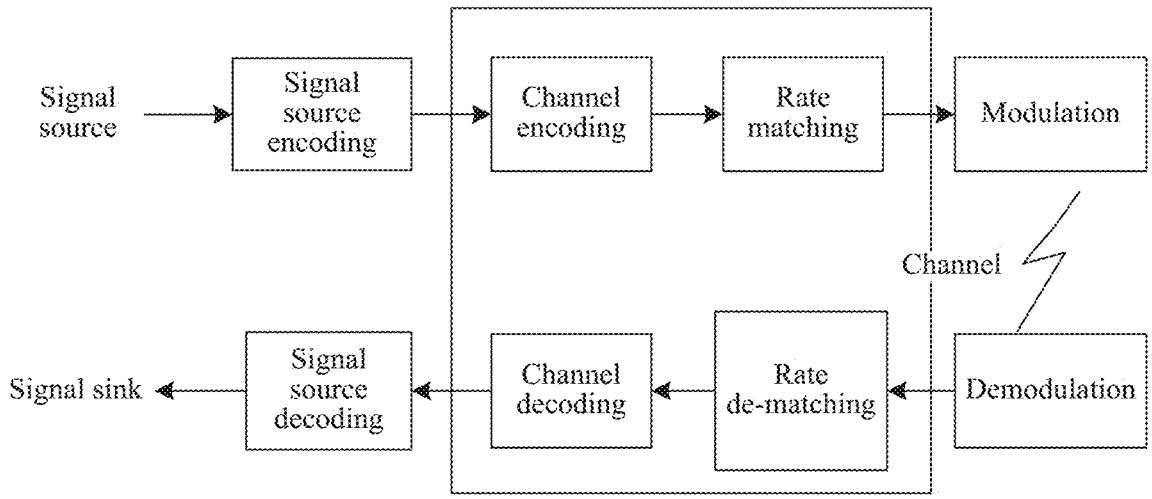
FIG. 2 is a schematic flowchart of a communications system according to an embodiment of this disclosure.
FIG. 3 is a flowchart of an embodiment of an encoding method according to an embodiment of this disclosure.

FIG. 2 is a schematic flowchart of a communications system. As shown in FIG. 2, at a transmit end, a signal source sequentially undergoes signal source encoding, channel encoding, rate matching (an optional step), and modulation, and then sending. At a receive end, the signal source sequentially undergoes demodulation, rate de-matching (an optional step), channel decoding, and signal source decoding, and is output to a signal sink. The embodiments of this application are mainly related to channel encoding and channel decoding (briefly referred to as channel encoding and decoding), and are described below by using specific examples. A polar code concatenated with CRC check may be used for channel encoding and decoding in the embodiments of this application.

This disclosure provides an encoding method and apparatus, so as to satisfy an FAR requirement. The method and the apparatus related to this application are applicable to both a control channel and a data channel, and are applicable to both uplink and downlink. The encoding method and apparatus provided in this application are described in detail below with reference to accompanying drawings.

FIG. 3 is a flowchart of an embodiment of an encoding method according to this application. As shown in FIG. 3, this embodiment is performed by a transmit end, and the method of this embodiment may include the following steps.

S101. The transmit end performs CRC encoding on A to-be-encoded information bits based on a CRC polynomial, to obtain a first bit sequence, where the first bit sequence includes L CRC bits and A information bits, and L and A are positive integers. L is also usually referred to as a CRC length.

In consideration of an FAR requirement, when L=11, the CRC polynomial can be any of a number of different polynomials, including any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+D+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$.

A specific process of performing CRC encoding based on a selected polynomial is the same as current general CRC encoding.

Specifically, after receiving the A to-be-encoded information bits, the transmit end adds the L CRC bits based on the CRC polynomial, to obtain the first bit sequence.

The A to-be-encoded information bits may be obtained by sorting to-be-sent information bits in ascending or descending order, or may be obtained by performing other processing on information bits. This is not limited herein.

Figure 4:
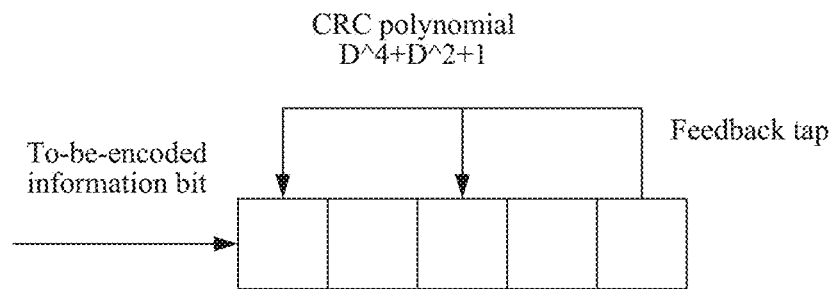
FIG. 4 is a schematic diagram of a CRC encoding manner according to an embodiment of this disclosure.

An implementation of CRC encoding is in a form of a shift register. For example, FIG. 4 shows a commonly used manner of implementing CRC encoding in a form of a shift register (briefly referred to as a register). A feedback tap of the register is determined by a CRC polynomial $D^4+D^2+1$, and content of the register is initialized to a preset value. During encoding, the to-be-encoded information bits are shifted from a side into the register bit by bit, and a bit exclusive-OR operation is performed on the feedback tap and a corresponding register status, so that the register status changes. After all to-be-encoded bits are shifted into the register, bits 0 whose quantity is equal to a quantity of bits of the CRC length are shifted into the register, then the register status is read, and the register status is used as a CRC bit, and is used as a code word of CRC encoding. The L CRC bits in the first bit sequence may be located after the A to-be-encoded information bits, may be located before the A to-be-encoded information bits, or may be located at any location on which a receive end and the transmit end agree.

S102. The transmit end interleaves the first bit sequence, to obtain a second bit sequence.

In the interleaving step, some bits in the first bit sequence may be interleaved, or all bits in the first bit sequence may be interleaved. It should be noted that, this step is an optional step: This step is necessary only when a location of an information bit and/or a CRC check bit needs to be adjusted; and if the location of the information bit and/or the CRC check bit does not need to be adjusted, this step may be omitted in an actual encoding process, and in this case, the second bit sequence in step S103 is the first bit sequence. A specific interleaving scheme is not content of this application, and details are not described.

S103. The transmit end performs polar encoding on the second bit sequence, to obtain a third bit sequence. When step S102 is omitted, this step is: The transmit end performs polar encoding on the first bit sequence, to obtain a third bit sequence.

An existing polar encoding method may be used as an encoding method for performing, by the transmit end, polar encoding on the second bit sequence. Details are not described herein.

S104 (not shown in the figure). The transmit end performs some or all steps of, including but not limited to, rate matching, modulation, analog-to-digital conversion, and frequency conversion on the third bit sequence, and then sends the third bit sequence.

It should be noted that, the rate matching step in step S104 is optional. If an encoding code length is the same as a code length of a target code, rate matching is not needed. This embodiment of the present disclosure does not emphasize step S104. Therefore, details are not described herein. For example, in a possible implementation, persons skilled in the art may make reference to practices in the prior art.

Based on the encoding method provided in this embodiment, the transmit end performs CRC encoding on the A to-be-encoded information bits based on the CRC polynomial provided in this application, to obtain the first bit sequence, and then performs interleaving (if necessary) and polar encoding on the first bit sequence. Therefore, after CRC is concatenated, the used polar encoding manner can satisfy the FAR requirement.

It should be noted that, after receiving to-be-decoded information bits, the receive end (a decoder side) also needs to perform CRC check based on the same CRC polynomial. Details are not described herein.

In this embodiment of this application, a decoding operation at the decoder end is roughly: receiving a to-be-decoded sequence, and performing polar decoding on the obtained to-be-decoded sequence based on a CRC polynomial.

Figure 5:
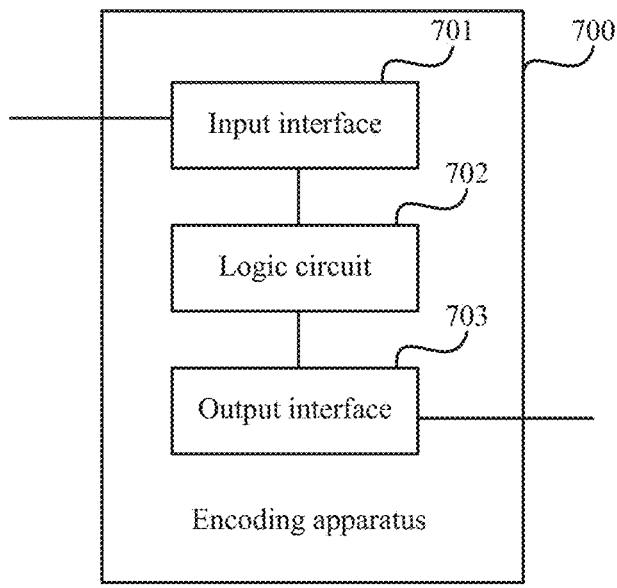
FIG. 5 is a first schematic structural diagram of an encoding apparatus according to an embodiment of this disclosure.

Consistent with the encoding method shown in FIG. 3, as shown in FIG. 5, an embodiment of this application further provides an apparatus 700. The encoding apparatus 700 is configured to perform the encoding method shown in FIG. 3. Some or all steps of the encoding method shown in FIG. 3 may be performed by using hardware or by using software. When some or all steps of the encoding method shown in FIG. 3 are performed by using hardware, the encoding apparatus 700 includes: an input interface 701, configured to obtain a to-be-encoded bit sequence; a logic circuit 702, configured to perform the encoding method shown in FIG. 3, where for details, refer to the description in the foregoing method embodiment, and details are not described herein again; and an output interface 703, configured to output an encoded bit sequence.

Optionally, during specific implementation, the encoding apparatus 700 may be a chip or an integrated circuit.

Figure 6:
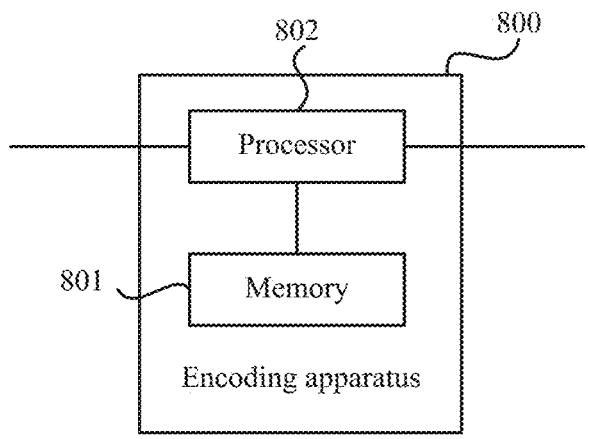
FIG. 6 is a second schematic structural diagram of an encoding apparatus according to an embodiment of this disclosure.

Optionally, when some or all steps of the encoding method of the foregoing embodiment are performed by using software, as shown in FIG. 6, an encoding apparatus 800 includes: a memory 801, configured to store a program; and a processor 802, configured to execute the program stored in the memory 801. When the program is executed, the encoding apparatus 800 performs the encoding method provided in the embodiment in FIG. 3.

Optionally, the memory 801 may be a physically independent unit, or may be integrated together with the processor 802.

Optionally, when some or all steps of the encoding method of the embodiment in FIG. 3 are performed by using software, the encoding apparatus 800 may include only the processor 802. The memory 801 configured to store the program is located outside the encoding apparatus 800, and the processor 802 is connected to the memory 801 by using a circuit or a wire, and is configured to read and execute the program stored in the memory 801.

The processor 802 may be a central processing unit (CPU), a network processor (NP), or a combination of a CPU and an NP. The processor 802 may further include a hardware chip. The hardware chip may be an application-specific integrated circuit (ASIC), a programmable logic device (PLD), or a combination thereof. The PLD may be a complex programmable logic device (CPLD), a field-programmable gate array FPGA), generic array logic (GAL), or any combination thereof.

The memory 801 may include a volatile memory, for example, a random access memory RAM). Alternatively, the memory 801 may include a non-volatile memory, for example, a flash memory, a hard disk drive (HDD), or a solid-state drive (SSD). Alternatively, the memory 801 may include a combination of the foregoing types of memories.

Figure 7:
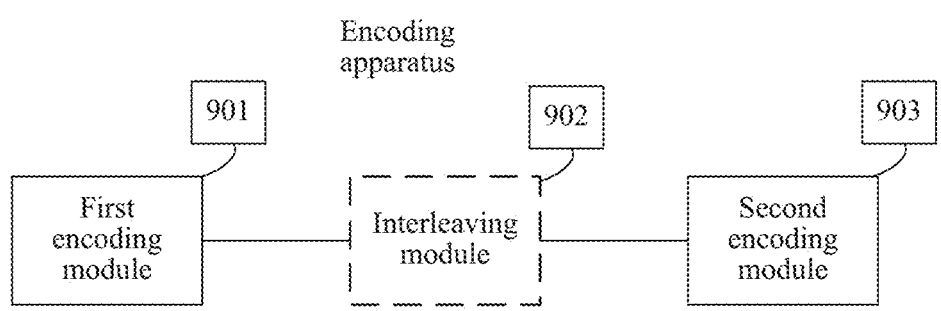
FIG. 7 is a third schematic structural diagram of an encoding apparatus according to an embodiment of this disclosure.

Consistent with the encoding method shown in FIG. 3, as shown in FIG. 7, an embodiment of this application further provides a schematic structural diagram of an embodiment of an encoding apparatus. The apparatus may include: a first encoding module 901, an interleaving module 902, and a second encoding module 903. The first encoding module 901 is configured to perform cyclic redundancy check CRC encoding on A to-be-encoded information bits based on a CRC polynomial, to obtain a first bit sequence, where the first bit sequence includes L CRC bits and A information bits, L and A are positive integers, L=11, and the CRC polynomial is any one of the following polynomials:

$D^{11}+D^{10}+D^9+D^5+1;$
$D^{11}+D^7+D^6+D^2+1;$
$D^{11}+D^{10}+D^9+D^6+D^4+D^2+1;$
$D^{11}+D^{10}+D^9+D^7+D^5+D+1;$
$D^{11}+D^9+D^8+D^6+D^5+D+1;$
$D^{11}+D^{10}+D^9+D^8+D^7+D^5+D^4+D+1;$
$D^{11}+D^{10}+D^3+D+1;$
$D^{11}+D^5+D^3+D+1;$
$D^{11}+D^{10}+D^9+D^8+D^6+D^5+D^3+D+1;$
$D^{11}+D^{10}+D^8+D^7+D^6+D^5+D^3+D+1;$
$D^{11}+D^9+D^7+D^6+D^5+D^4+D^3+D+1;$
$D^{11}+D^{10}+D^9+D^7+D^6+D^3+D^2+D+1;$ or
$D^{11}+D^8+D^6+D^5+D^4+D^3+D^2+D+1.$

Usually, the CRC polynomial used for CRC encoding is implemented by using a shift register. The L CRC bits in the first bit sequence may be located after the A to-be-encoded information bits, may be located before the A to-be-encoded information bits, or may be located at any location on which a receive end and a transmit end agree. The interleaving module 902 is an optional module, and is configured to perform an interleaving operation on the first bit sequence, to obtain a second bit sequence. This module is necessary only when a location of an information bit and/or a CRC check bit needs to be adjusted in a manner such as distributed CRC. If the location of the information bit and/or the CRC check bit does not need to be adjusted, this module may be omitted in an actual encoding process, and in this case, the second bit sequence is the first bit sequence. The second encoding module 903 is configured to perform polar encoding on the second bit sequence, and when there is no interleaving module 902, the second encoding module 903 is configured to perform polar encoding on the first bit sequence.

It should be noted that, modules such as a rate matching module, a modulation module, and a sending module are not drawn in FIG. 7. The sending module is configured to send an encoded sequence, and certainly, before the encoded sequence is sent, operations such as rate matching (if necessary) and modulation further need to be performed.

Figure 8:
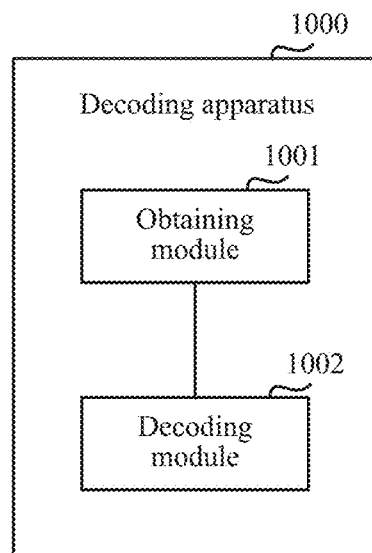
FIG. 8 is a first schematic structural diagram of a decoding apparatus according to an embodiment of this disclosure.

As shown in FIG. 8, an embodiment of this application further provides a decoding apparatus 1000. The decoding apparatus 1000 may be configured to perform the decoding method provided in the embodiment of this application, and the decoding apparatus 1000 includes:

an obtaining module 1001, configured to obtain a to-be-decoded bit sequence; and a decoding module 1002, configured to perform a decoding operation on the to-be-decoded bit sequence according to a decoding method, where the decoding method is determined based on a CRC polynomial and a polar encoding method.

Figure 9:
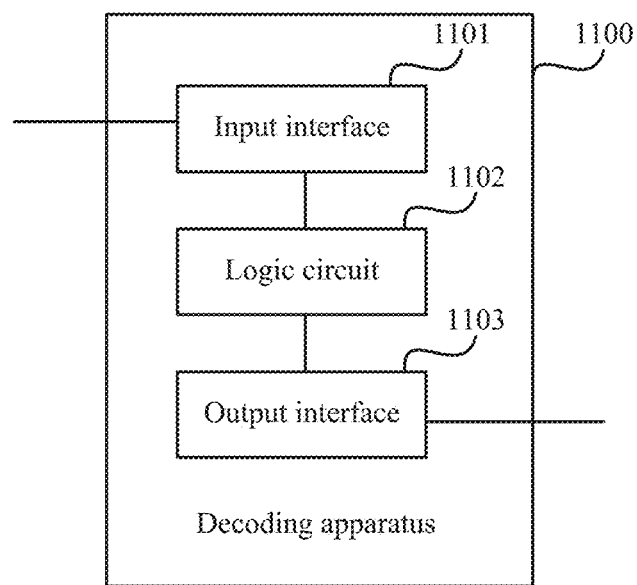
FIG. 9 is a second schematic structural diagram of a decoding according to an embodiment of this disclosure.

Consistent with the decoding method provided in the foregoing embodiment, as shown in FIG. 9, an embodiment of this application further provides a decoding apparatus 1100. The decoding apparatus 1100 is configured to perform the foregoing decoding method. Some or all steps of the foregoing decoding method may be performed by using hardware or by using software. When some or all steps of the foregoing decoding method are performed by using hardware, the decoding apparatus 1100 includes: an input interface 1101, configured to obtain a to-be-decoded bit sequence; a logic circuit 1102, configured to perform the foregoing decoding method; and an output interface 1103, configured to output a decoded sequence.

Optionally, during specific implementation, the decoding apparatus 1100 may be a chip or an integrated circuit.

Figure 10:
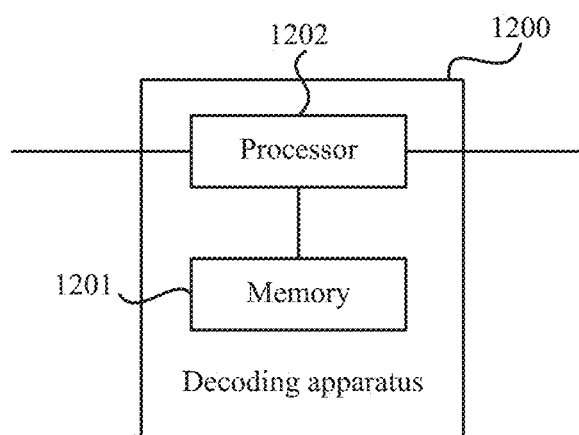
FIG. 10 is a third schematic structural diagram of a decoding apparatus according to an embodiment of this disclosure.

Optionally, when some or all steps of the decoding method of the foregoing embodiment are performed by using software, as shown in FIG. 10, a decoding apparatus 1200 includes: a memory 1201, configured to store a program; and a processor 1202, configured to execute the program stored in the memory 1201. When the program is executed, the decoding apparatus 1200 performs the decoding method provided in the foregoing embodiment.

Optionally, the memory 1201 may be a physically independent unit, or may be integrated together with the processor 1202.

Optionally, when some or all steps of the decoding method of the foregoing embodiment are performed by using software, the decoding apparatus 1200 may include only the processor 1202. The memory 1201 configured to store the program is located outside the decoding apparatus 1200, and the processor 1202 is connected to the memory 1201 by using a circuit or a wire, and is configured to read and execute the program stored in the memory 1201.

The processor 1202 may be a central processing unit (CPU), a network processor (NP), or a combination of a CPU and an NP.

The processor 1202 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory 1201 may include a volatile memory, for example, a random access memory (RAM). Alternatively, the memory 1201 may include a non-volatile memory, for example, a flash memory, a hard disk drive (HDD), or a solid-state drive (SSD). Alternatively, the memory 1201 may include a combination of the foregoing types of memories.

Figure 11:
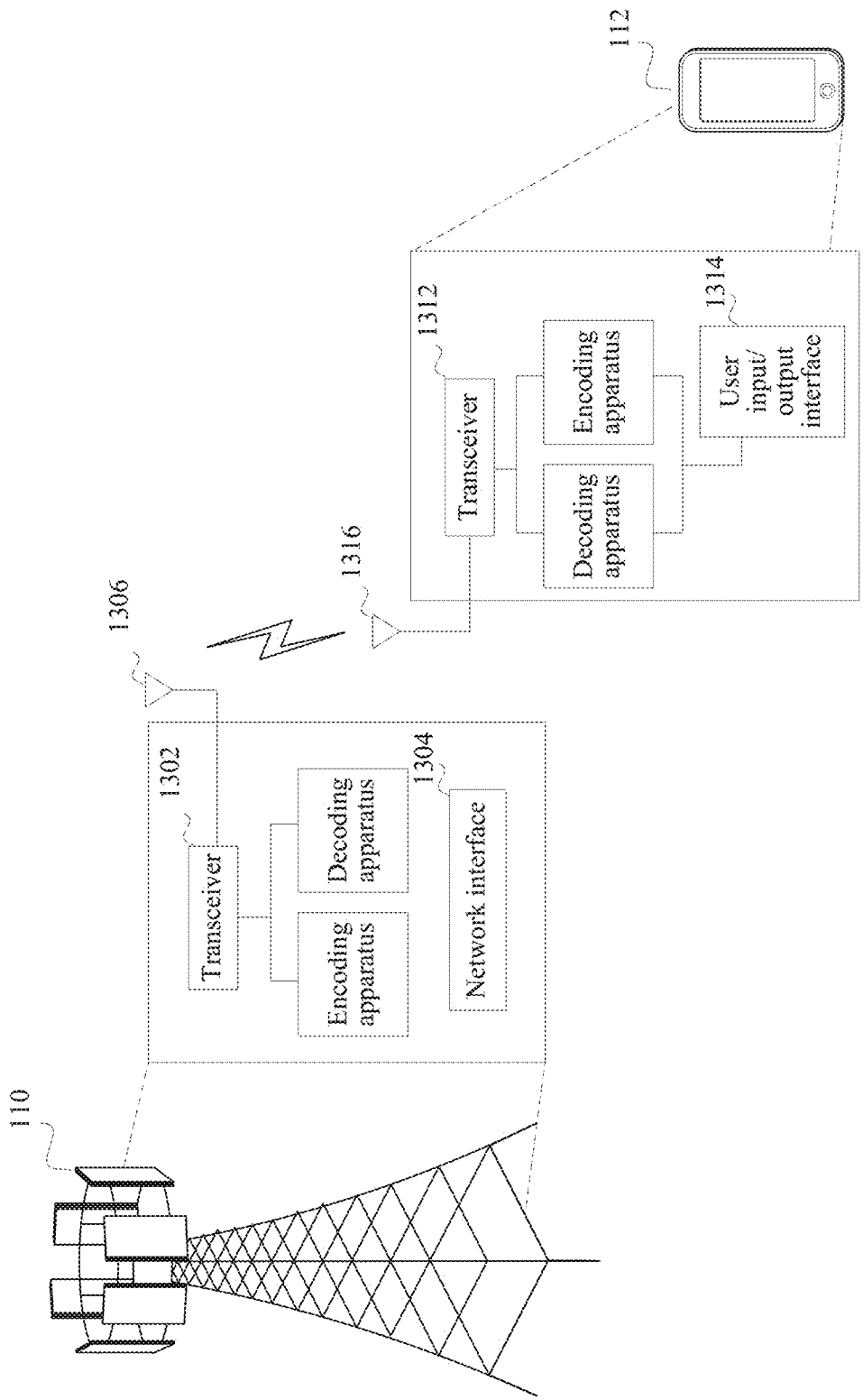
FIG. 11 is a schematic structural diagram of a network device and a terminal according to an embodiment of this disclosure.

An embodiment of this application further provides a network device. Referring to FIG. 11, the foregoing encoding apparatus and/or decoding apparatus may be installed in the network device 110. In addition to the foregoing encoding apparatus and decoding apparatus, the network device 110 may further include a transceiver 1302. A bit sequence encoded by the encoding apparatus undergoes subsequent changes or processing and is then sent by the transceiver 1302 to a terminal 112, or the transceiver 1302 is further configured to receive information or data from a terminal 112. The information or data undergoes a series of processing and is converted into a to-be-decoded sequence, and the to-be-decoded sequence is processed by the decoding apparatus to obtain a decoded sequence. The network device 110 may further include a network interface 1304, configured to communicate with another network device.

Likewise, the foregoing encoding apparatus and/or decoding apparatus may be configured in the terminal 112. In addition to the foregoing encoding apparatus and/or decoding apparatus, the terminal 112 may further include a transceiver 1312. A bit sequence encoded by the encoding apparatus undergoes subsequent changes or processing (including but not limited to some or all of rate matching, modulation, digital-to-analog conversion, and frequency conversion) and is then sent by the transceiver 1312 to the network device 110, or the transceiver 1312 is further configured to receive information or data from the network device 110. The information or data undergoes a series of processing (including but not limited to some or all of frequency conversion, analog-to-digital conversion, demodulation, and rate de-matching) and is converted into a to-be-decoded sequence, and the to-be-decoded sequence is processed by the decoding apparatus to obtain a decoded sequence. The terminal 112 may further include a user input/output interface 1314, configured to receive information entered by a user. Information that needs to be sent to the network device 110 needs to be processed by an encoder and then sent by the transceiver 1312 to the network device 110. After undergoing subsequent processing, data decoded by a decoder may be presented to the user by using the input/output interface 1314.

An embodiment of this application further provides a computer storage medium that stores a computer program. The computer program is used to perform the encoding method shown in FIG. 3 and the foregoing embodiment and the decoding method provided in the foregoing embodiment.

An embodiment of this application further provides a polar encoding apparatus, including any one of the encoding apparatuses in FIG. 5 to FIG. 7 and any one of the decoding apparatuses in FIG. 8 to FIG. 10.

An embodiment of this application further provides a computer program product including an instruction. When the instruction runs on a computer, the computer performs the encoding method shown in FIG. 3 and the decoding method provided in the foregoing embodiment.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, and an optical memory) that include computer-usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or another programmable device provide steps for implementing a specific function in one or more processes in the flowcharts and/or in one or more blocks in the block diagrams.

Although some embodiments of this application have been described, persons skilled in the art can make changes and modifications to these embodiments. Therefore, the following claims are intended to be construed as to cover the preferred embodiments and all changes and modifications falling within the scope of this application.

Obviously, persons skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

The invention claimed is:

1. An encoding method, comprising:
performing, by a transmit end and based on a cyclic redundancy check (CRC) polynomial, CRC encoding on A to-be-encoded information bits, to obtain a CRC-encoded bit sequence, wherein the CRC-encoded bit sequence comprises L CRC bits and the A to-be-encoded information bits, L and A are positive integers, L=11, and the CRC polynomial is any one of the following polynomials:
$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+D+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and
performing, by the transmit end, polar encoding on the CRC-encoded bit sequence to obtain a polar-encoded bit sequence;
rate matching and modulating, by the transmit end, the polar-encoded bit sequence to obtain a modulated sequence; and
outputting, by the transmit end, the modulated sequence.

2. The method according to claim 1, wherein the CRC polynomial is implemented by using a shift register.

3. The method according to claim 1, wherein the L CRC bits in the CRC-encoded bit sequence are located after the A to-be-encoded information bits.

4. The method according to claim 1, wherein the method further comprises:
sending, by the transmit end, the polar-encoded bit sequence.

5. The method according to claim 1, wherein the transmit end is a base station or a terminal.

6. An encoding apparatus, comprising a processor, wherein the processor is configured to:
perform, based on a cyclic redundancy check (CRC) polynomial, CRC encoding on A to-be-encoded information bits, to obtain a CRC-encoded bit sequence, wherein the CRC-encoded bit sequence comprises L CRC bits and the A to-be-encoded information bits, L and A are positive integers, L=11, and the CRC polynomial is any one of the following polynomials:
$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+D+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and
perform polar encoding on the CRC-encoded bit sequence to obtain a polar-encoded bit sequence;
perform rate matching and modulating on the polar-encoded bit sequence to obtain a modulated sequence; and
output the modulated sequence.

7. The apparatus according to claim 6, wherein the encoding apparatus further comprises a memory, and the memory is configured to store a program instruction executed by the processor.

8. The apparatus according to claim 6, wherein the CRC polynomial is implemented by using a shift register.

9. The apparatus according to claim 6, wherein the L CRC bits in the CRC-encoded bit sequence are located after the A to-be-encoded information bits.

10. The apparatus according to claim 6, wherein the apparatus further comprises a transceiver, configured to send the polar-encoded bit sequence.

11. The apparatus according to claim 6, wherein the apparatus is a base station or a terminal.

12. An encoding apparatus, comprising:
an input interface, configured to obtain A to-be-encoded information bits;
a logic circuit, configured to: perform, based on a cyclic redundancy check (CRC) polynomial, CRC encoding on the A to-be-encoded information bits, to obtain a CRC-encoded bit sequence, wherein the CRC-encoded bit sequence comprises L CRC bits and the A to-be-encoded information bits, L and A are positive integers, L=11, and the CRC polynomial is any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and perform polar encoding on the CRC-encoded bit sequence to obtain a polar-encoded bit sequence; and perform rate matching and modulating on the polar-encoded bit sequence to obtain a modulated sequence; and an output interface, configured to output the modulated sequence.

13. The apparatus according to claim 12, wherein the CRC polynomial is implemented by using a shift register.

14. The apparatus according to claim 12, wherein the L CRC bits in the CRC-encoded bit sequence are located after the A to-be-encoded information bits.

15. The apparatus according to claim 12, wherein the apparatus is a chip or an integrated circuit.

16. A system, comprising:
at least one processor;
a non-transitory computer-readable storage medium coupled to the at least one processor and storing programming instructions for execution by the at least one processor, wherein the programming instructions instruct the at least one processor to:
obtain A to-be-encoded information bits, that performs, a cyclic redundancy check (CRC) encoding using a CRC polynomial on the A to-be-encoded information bits to obtain a CRC-encoded bit sequence and applies a polar encoding to the CRC-encoded bit sequence, wherein the CRC-encoded bit sequence comprises L CRC bits and the A to-be-encoded information bits, L and A are positive integers, L=11, and the CRC polynomial is any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and perform rate matching and modulating on the polar-encoded bit sequence to obtain a modulated sequence; and a transceiver to transmit the modulated sequence.

17. The system according to claim 16, wherein the CRC polynomial is implemented by using a shift register.

18. The system according to claim 16, wherein the L CRC bits in the CRC-encoded bit sequence are located after the A to-be-encoded information bits.

19. A non-transitory computer-readable storage medium, comprising computer instructions, when executed, the computer instructions cause a computer to perform:
obtaining A to-be-encoded information bits;
performing, based on a cyclic redundancy check (CRC) polynomial, CRC encoding on the A to-be-encoded information bits, to obtain a CRC-encoded bit sequence, wherein the CRC-encoded bit sequence comprises L CRC bits and the A to-be-encoded information bits, L and A are positive integers, L=11, and the CRC polynomial is any one of the following polynomials:

$D^{11}+D^{10}+D^9+D^5+1$;
$D^{11}+D^7+D^6+D^2+1$;
$D^{11}+D^{10}+D^9+D^6+D^4+D^2+1$;
$D^{11}+D^{10}+D^9+D^7+D^5+1$;
$D^{11}+D^9+D^8+D^6+D^5+D+1$;
$D^{11}+D^{10}+D^9+D^8+D^7+D^5+D^4+D+1$;
$D^{11}+D^{10}+D^3+D+1$;
$D^{11}+D^5+D^3+D+1$;
$D^{11}+D^{10}+D^9+D^8+D^6+D^5+D^3+D+1$;
$D^{11}+D^{10}+D^8+D^7+D^6+D^5+D^3+D+1$;
$D^{11}+D^9+D^7+D^6+D^5+D^4+D^3+D+1$;
$D^{11}+D^{10}+D^9+D^7+D^6+D^3+D^2+D+1$; or
$D^{11}+D^8+D^6+D^5+D^4+D^3+D^2+D+1$; and;

performing polar encoding on the CRC-encoded bit sequence to obtain a polar-encoded bit sequence;
rate matching and modulating the polar-encoded bit sequence to obtain a modulated sequence; and
outputting the modulated sequence.

20. The non-transitory computer-readable storage medium according to claim 19, wherein the L CRC bits in the CRC-encoded bit sequence are located after the A to-be-encoded information bits.

* * * * *